US012694170B2

(12) United States Patent
Hein et al.

(10) Patent No.: US 12,694,170 B2
(45) Date of Patent: Jul. 28, 2026

(54) PRODUCTION OF A TURBOMACHINE VANE

(71) Applicant: Siemens Energy Global GmbH & Co. KG, Munich (DE)

(72) Inventors: Daniel Hein, Munich (DE); Felix Kuntze-Fechner, Krefeld (DE); Christian Peeren, Berlin (DE); Volkmar Sterzing, Neubiberg (DE)

(73) Assignee: SIEMENS ENERGY GLOBAL GMBH & CO. KG, Munich (DE)

( * ) Notice: Subject to any disclaimer, the term of this patent is extended or adjusted under 35 U.S.C. 154(b) by 1232 days.

(21) Appl. No.: 17/254,557

(22) PCT Filed: Jul. 2, 2019

(86) PCT No.: PCT/EP2019/067706
§ 371 (c)(1),
(2) Date: Dec. 21, 2020

(87) PCT Pub. No.: WO2020/007844
PCT Pub. Date: Jan. 9, 2020

(65) Prior Publication Data
US 2021/0271789 A1 Sep. 2, 2021

(30) Foreign Application Priority Data
Jul. 3, 2018 (DE) ..................... 10 2018 210 894.3

(51) Int. Cl.
*G06F 30/17* (2020.01)
(52) U.S. Cl.
CPC .................................... *G06F 30/17* (2020.01)
(58) Field of Classification Search
CPC ........... G06F 30/27; G06F 30/15; G06F 30/17
See application file for complete search history.

(56) References Cited

U.S. PATENT DOCUMENTS

| | | | |
|---|---|---|---|
| 5,303,328 | A | 4/1994 | Masui |
| 6,850,874 | B1 | 2/2005 | Higuerey |

(Continued)

FOREIGN PATENT DOCUMENTS

| | | |
|---|---|---|
| CN | 102873558 A | 1/2013 |
| CN | 104778327 A | 7/2015 |
| CN | 104834772 A | 8/2015 |

OTHER PUBLICATIONS

Aerospace Manufacturing and Design, Reference Guide "Quality in Aerospace Turbine Blade Metrology", Jan. 2007, URL: www(dot)aerospacemanufacturinganddesign(dot)com/article/quality-in-aerospace-turbine-blade-metrology/ (Year: 2007).*

(Continued)

*Primary Examiner* — David A Hopkins
(74) *Attorney, Agent, or Firm* — Wolter Van Dyke Davis, PLLC

(57) ABSTRACT

A method for designing a turbomachine vane, in which predefined input parameters are transmitted to a neuronal network system and vane parameters are determined and output by the neuronal network system based on the transmitted input parameters. The neuronal network system has several separate neuronal networks each with an output layer, each of which determines one or more of the vane parameters and outputs same via the output layer. A first neuronal network and a second neuronal network belong to the separate neuronal networks of the neuronal network system and the vane parameter(s) which are determined by the first neuronal network and output via the output layer of said neuronal network differ(s) from the vane parameter(s) that are determined by the second neuronal network and are output via the output layer of said neuronal network.

9 Claims, 6 Drawing Sheets

(56) References Cited

U.S. PATENT DOCUMENTS

| | | | |
|---|---|---|---|
| 6,961,719 | B1 | 11/2005 | Rai |
| 7,191,161 | B1 | 3/2007 | Rai et al. |
| 9,984,062 | B1 | 5/2018 | Strope |
| 2003/0163436 | A1 | 8/2003 | Seifert |
| 2005/0209982 | A1 | 9/2005 | Jin |
| 2008/0111543 | A1 | 5/2008 | Joubert |

OTHER PUBLICATIONS

Arabnia, Mohammad. Aerodynamic shape optimization of axial turbines in three dimensional flow. Diss. Concordia University, 2012 (Year: 2012).*
Babaeizadeh, Mohammad, Paris Smaragdis, and Roy H. Campbell. "Noiseout: A simple way to prune neural networks." arXiv preprint arXiv:1611.06211 (2016). (Year: 2016).*
Cervantes, Noel. An Evolutionary Strategies Method to Optimize Turbine and Compressor Blades. MS thesis. Auburn University, 2018. (Year: 2018).*
Goel, Sanjay. "Turbine Airfoil Optimization Using Quasi-3D Analysis Codes." International Journal of Aerospace Engineering 2009.1 (2009): 531358 (Year: 2009).*
Gohari, Seyyed Mohammad Iman, and Alireza Ghasemi K. "Introducing New Compact Parameterization Method for an Automated Blade Shape Optimization." 21st AIAA Computational Fluid Dynamics Conference. 2013 (Year: 2013).*
Heaton, "The Number of Hidden Layers", Heaton Research, Blog Posting, URL: www(dot)heatonresearch(dot)com/2017/06/01/hidden-layers(dot)html, Jun. 2017 (Year: 2017).*
Larsen, G. C., Hansen, M. H., Baumgart, A., & Carlén, I. (2002). Modal analysis of wind turbine blades. Denmark. Forskningscenter Risoe. Risoe-R No. 1181(EN) (Year: 2002).*
Manson, S. S. "Factors Affecting Vibration of Axial-Flow Compressor Blades SS Manson, AJ Meyer, Jr., HF Calvert, and MP Hanson." Proceedings of the society for experimental stress analysis 7.2 (1950): 1. (Year: 1950).*
Mengistu, Temesgen Teklemariam. Aerodynamic design and optimization of turbomachinery blading. Diss. Concordia University, 2005. (Year: 2005).*
Merriam Webster Dictionary, definition of "Bezier curve", URL: www(dot)merriam-webster(dot)com/dictionary/Bezier%20curve, accessed Jul. 16, 2024 (Year: 2024).*
Post, Nathan. Fatigue test design: Scenarios for biaxial fatigue testing of a 60-meter wind turbine blade. No. NREL/TP-5000-65227. National Renewable Energy Lab.(NREL), Golden, CO (United States), 2016. (Year: 2016).*
Rai, M. "Three-dimensional aerodynamic design using artificial neural networks." 40th AIAA Aerospace Sciences Meeting & Exhibit. 2002. (Year: 2002).*
Rai, Man. "A rapid aerodynamic design procedure based on artificial neural networks." 39th Aerospace Sciences Meeting and Exhibit. 2001. (Year: 2001).*
Silipo et al., "Seven Techniques for Dimensionality Reduction", 2014, URL: www(dot)knime(dot)com/sites/default/files/inline-images/knime_seventechniquesdatadimreduction(dot)pdf (Year: 2014).*
Zhou, Zhi-Hua, Jianxin Wu, and Wei Tang. "Ensembling neural networks: many could be better than all." Artificial intelligence 137.1-2 (2002): 239-263 (Year: 2002).*
Syam et al., "Optimization of CDA Cascade using Parameterization and Genetic Algorithm coupled with CFD", 2013. 2nd International Conference on Mechanical, Automotive and Aerospace Engineering (ICMAAE 2013) (Year: 2013).*
Uelschen, Michael, and Martin Lawerenz. "Design of axial compressor airfoils with artificial neural networks and genetic algorithms." Fluids 2000 Conference and Exhibit. 2000. (Year: 2000).*
Van den Braembussche, René A. "Numerical optimization for advanced turbomachinery design." Optimization and computational fluid dynamics. Berlin, Heidelberg: Springer Berlin Heidelberg, 2008 (Year: 2008).*

Van den Braembussche, Rene A. "Turbomachinery component design by means of CFD." Task Quarterly 6.1 (2002): 39-61 (Year: 2002).*
Asafuddoula, Md, Brijesh Verma, and Mengjie Zhang. "A divide-and-conquer-based ensemble classifier learning by means of many-objective optimization." IEEE Transactions on Evolutionary Computation 22.5 (2017): 762-777. (Year: 2017).*
Awad, Mohammed. "Enhanced hybrid method of divide-and-conquer and RBF neural networks for function approximation of complex problems." Turkish Journal of Electrical Engineering and Computer Sciences 25.2 (2017): 1095-1105. (Year: 2017).*
Bhagat, Smriti, and Dipti Deodhare. "Divide and conquer strategies for MLP training." The 2006 IEEE International Joint Conference on Neural Network Proceedings. IEEE, 2006. (Year: 2006).*
Chiang, Cheng-Chin, and Hsin-Chia Fu. "A divide-and-conquer methodology for modular supervised neural network design." Proceedings of 1994 IEEE International Conference on Neural Networks (ICNN'94). vol. 1. IEEE, 1994. (Year: 1994).*
Frosyniotis, Dimitrios, Andreas Stafylopatis, and Aristidis Likas. "A divide-and-conquer method for multi-net classifiers." Pattern Analysis & Applications 6.1 (2003): 32-40. (Year: 2003).*
Fu, Hsin-Chia, et al. "Divide-and-conquer learning and modular perceptron networks." IEEE transactions on neural networks 12.2 (2001): 250-263. (Year: 2001).*
Hardwick, Jonathan C. Practical parallel divide-and-conquer algorithms. No. CMUCS97197. 1997 (Year: 1997).*
McDonnell, Tyler, et al. "Divide and conquer: neuroevolution for multiclass classification." Proceedings of the genetic and evolutionary computation conference. 2018. (Year: 2018).*
Qiu, Hai, et al. "Anomaly detection using data clustering and neural networks." 2008 IEEE International Joint Conference on Neural Networks (IEEE World Congress on Computational Intelligence). IEEE, 2008. (Year: 2008).*
Romeo, Emanuele. "Systematic Analysis of Nonlinear Reduced-Order Models for Aeroelastic Applications." 2016. University Degli Studi Di Padova. (Year: 2016).*
Suh, T. J., and Ibrahim I. Esat. "Solving large scale combinatorial optimisation problems based on a divide and conquer strategy." Neural Computing & Applications 7.2 (1998): 166-179. (Year: 1998).*
Sanz, Jose M; "A Neural Network Aero Design System for Advanced Turbo-Engines" (availalbe at: https://ntrs.nasa.gov/search.jsp?R=19990019840); 1999.
Zhou, Fan_Zhen et al. "The Development of Highly Loaded Turbine Rotating Blades by Using 3D Optimization Design Method of Turbomachinery Blades Based on Artificial Neural Network & Genetic Algorithm"; released in Chinese Journal of Aeronautics vol. 16 No. 4; 2003).
Wikipedia: "Pruning"; Version from Jan. 22, 2018; English machine translation attached.
Sanz Jose M : "A Neural Network Aero Design System for Advanced Turbo-Engines", XP055628340, Found on the Internet: URL:https://ntrs.nasa.gov/archive/nasa/casi.ntrs.nasa.gov/20000012455.pdf> pp. 1-4; 1999.
Dongyun Lu et al: "Neural network based torque control of switched reluctance motor for hybrid electric vehicle propulsion at low speeds", Electro/Information Technology, 2009. EIT'09. IEEE International Conference on, IEEE, Piscataway, NJ, USA, pp. 417-422, XP031499388, ISBN: 978-1-4244-3354-4; pp. 419; 2009.
Juyong et al: "SplitNet: Learning to Semantically Split Deep Networks for Parameter Reduction and Model Parallelization", XP055534564, Found on the Internet: URL:http://proceedings.mlr.press/v70/kim17b/kim17b.pdf; [retrieved on Dec. 14, 2018]; Abstract; Figure 1; 2017.
PCT International Search Report and Written Opinion of International Searching Authority mailed Oct. 14, 2019 corresponding to PCT International Application No. PCT/EP2019/067706 filed Jul. 2, 2019.
Pei, Ji, et al. "Optimization on the Impeller of a Low-specific-speed Centrifugal Pump for Hydraulic Performance Improvement", Chinese Journal of Mechanical Engineering, National Research Center of Pumps and Pumping System, Engineering and Technology, Jiangsu University, Zhenjiang, China, vol. 29, No. 5; 2016; DOI: 10.3901/CJME.2016.0519.069.

(56) References Cited

OTHER PUBLICATIONS

Yuan, Shouqi, et al. "Performance Predicting of Centrifugal Pumps with Compound Impeller Based on Improved BP Neural Network", Journal of Agricultural Mechanics, pp. 31, 83-86, vol. 40, issue 9; Zhenjiang, China, 2009; English abstract on p. 1.

Yu, Rui, "Aerodynamic Optimization Design of Airfoils Based on Adaptive Kriging Surrogate Model, Journal Of Chinese Society Of Power Engineering", Nr. 02 pp. 103-108, 133; 2014; English abstract on p. 1.

Sivashanmugam, Vadivel Kumaran, "Three Dimensional Aero-Structural Shape Optimization of Turbomachinery Blades", Thesis, Jan. 6, 2011, Concordia University.

Sun, Qi et al., "Optimization Design of IGV Profile in Centrifugal Compressor", Mathematical Problems in Engineering, Dec. 19, 2017, vol. 2017, 8437325.

* cited by examiner

PRODUCTION OF A TURBOMACHINE VANE

CROSS REFERENCE TO RELATED APPLICATIONS

This application is the US National Stage of International Application No. PCT/EP2019/067706 filed 2 Jul. 2019, and claims the benefit thereof. The International Application claims the benefit of German Application No. DE 10 2018 210 894.3 filed 3 Jul. 2018. All of the applications are incorporated by reference herein in their entirety.

FIELD OF INVENTION

The invention relates to a method for designing a turbomachine blade. Furthermore, the invention relates to a method for producing a turbomachine blade. Furthermore, the invention relates to a computer unit and a machine-readable storage medium.

BACKGROUND OF INVENTION

Designing a turbomachine blade is a complex process. This is attributable inter alia to the fact that, firstly, the characterization of a turbomachine blade typically requires a plurality of blade parameters and the turbomachine blade to be designed is intended to satisfy various boundary conditions (in particular from different technical disciplines, such as fluid dynamics, strength, heat engineering, etc.) and, secondly, there is often only little explicit knowledge available about the most complex relationships/dependencies between the required boundary conditions and the blade parameters that enable the boundary conditions to be complied with.

In numerous technical fields, artificial neural networks have proved to be successful here at learning complex relationships/dependencies between different parameters independently (on the basis of training data). In particular, a (trained) artificial neural network can be used to predict blade parameters of a turbomachine blade that enable desired boundary conditions to be complied with.

Methods for designing turbomachine blades, in particular turbine blades, are disclosed for example in the conference report "A Neural Network Aero Design System for Advanced Turbo-Engines" by Jose M. Sanz and in the article "The Development of Highly Loaded Turbine Rotating Blades by Using 3D Optimization Design Method of Turbomachinery Blades Based on Artificial Neural Network & Genetic Algorithm" by Fan-zhen Zhou et al. (published in Chinese Journal of Aeronautics vol. 16 No. 4).

SUMMARY OF INVENTION

It is an object of the invention to improve the process of designing a turbomachine blade on the basis of the use of neural networks, and in particular the production of a turbomachine blade on the basis of such a design process.

This object is achieved according to the invention by means of a method, by means of a computer unit, and by means of a machine-readable storage medium as claimed.

Advantageous configurations of the invention are the subject matter of the further patent claims and of the following description.

In the method according to the invention for designing a turbomachine blade, predefined input parameters are communicated to a neural network system. The neural network system determines blade parameters on the basis of the communicated input parameters and outputs said blade parameters. The invention provides for the neural network system to comprise a plurality of separate neural networks each having an output layer, each of which neural networks determines one or more of the blade parameters and outputs same via its output layer. A first neural network and a second neural network belong to the separate neural networks of the neural network system. Furthermore, according to the invention, it is provided that the blade parameter(s) which is/are determined by the first neural network and output via the output layer thereof is/are different than the blade parameter (s) which is/are determined by the second neural network and output via the output layer thereof.

To put it another way, the invention provides for enabling the blade parameters that are to be determined to be determined by separate neural networks (that is to say that not all of the blade parameters to be determined are determined are the same neural network). As a result—compared with the case where all of the blade parameters are determined by the same neural network—the respective neural network of the neural network system has to determine fewer (different) blade parameters and it is possible to achieve an improvement in the prediction accuracy of the blade parameters determined by the neural network system or a reduction of the (prediction) errors of the blade parameters determined by the neural network system.

In the present case, the "prediction accuracy" of a blade parameter determined by the neural network system refers to how close the value of the blade parameter determined by the neural network system is to the optimum blade parameter with which the required input parameters can best be realized. The closer the value of the blade parameter determined by the neural network system is to the optimum blade parameter value, the higher the prediction accuracy of this blade parameter (and the lower the (prediction) error thereof).

Furthermore, the blade parameter determination divided between separate neural networks makes it possible to determine physically used blade parameters (such as different thickness parameters, for example) with the aid of the same neural network, while other blade parameters related to one another (such as different curvature parameters, for example) are determined with the aid of a different neural network of the neural network system. That is to say that the division of the blade parameter determination between different neural networks can be effected problem-specifically taking account of physical relationships. In such a case, the blade parameter determination divided between separate neural networks has a particularly advantageous effect on the prediction accuracy of the blade parameters.

The neural networks of the neural network system are artificial neural networks. To allow a better flow in the course of reading, the term "artificial" is omitted in the present description and in the patent claims.

The turbomachine blade to be designed can be for example a turbine blade or compressor blade, in particular for a gas turbine installation.

As mentioned above, blade parameters are output by the neural network system or the neural networks thereof. That is to say that the blade parameters constitute output parameters of the neural network system or of the neural networks thereof.

Blade parameters within the meaning of the present invention are such parameters which characterize the turbomachine blade per se and/or characterize the arrangement/orientation thereof in a blade ring.

Expediently, each of the neural networks of the neural network system has an input layer in addition to its output layer.

The input parameters communicated to the neural network system advantageously relate to desired boundary conditions for the turbomachine blade, to desired boundary conditions for a blade ring comprising a plurality of such turbomachine blades, and/or to desired boundary conditions for a fluid flow (to be realized with the aid of the blade or the blade ring).

Furthermore, at least some of the blade parameters can relate to one blade section or to different blade sections between an end of the turbomachine blade on the hub side and an end of the turbomachine blade remote from the hub.

As mentioned above, a first neural network and a second neural network belong to the neural network system. In addition, the neural network system can comprise at least one further neural network which determines one or more blade parameters and outputs same via its output layer, said blade parameter(s) being different than the blade parameters determined by the first neural network and the second neural network.

The respective neural network of the neural network system is trained with the aid of training data before the blade parameters are determined.

The training data are advantageously an improper or proper subset of a basic training data set. The basic training data set can comprise for example data which were obtained during earlier designs of turbomachine blades and/or during earlier optimizations of blade designs. In other words, the basic training data set can comprise data from earlier design and/or optimization projects. These data can be based in particular on measurements and/or simulations.

It is advantageous if a check is made to ascertain whether the basic training data set contains redundant parameters. Redundant parameters present, if appropriate, can then be filtered. As a result, the number of input parameters required for determining the blade parameters can be kept small and the topology of the neural network system can be kept simple. Furthermore, the training times for the individual neural networks can be kept short.

Advantageously, the training data used for training the neural networks correspond to the basic training data set or, if the basic training data set contains redundant parameters, correspond to the basic training data set purged of the redundant parameters.

The check as to whether the basic training data set contains redundant parameters can be effected for example by means of statistical methods, in particular on the basis of Pearson correlation coefficients. Before a decision is taken as to whether a parameter from the basic training data set is not included in the training data, a check is advantageously made to ascertain whether said parameter is redundant not only from a statistical standpoint but also from a physical standpoint. This makes it possible to avoid a situation in which a parameter from the basic training data set is not included in the training data merely because a random statistical relationship between this parameter and a further parameter from the basic training data set was established.

Within the meaning of the present invention, a parameter from the basic training data set can be redundant particularly if there is a correlation, such as a linear relationship, for example, between this parameter and another parameter from the basic training data set. Methods such as "input merging" or "adaptive feature selection by using mutual information", for example, can be used for finding correlations between parameters from the basic training data set.

The blade parameters determined by the neural network system comprise geometric blade parameters.

At least some of the geometric blade parameters can characterize for example a blade section (that is to say a profile of the turbomachine blade). Furthermore, at least some of the geometric blade parameters can relate to different blade sections between the end of the turbomachine blade on the hub side and the end of the turbomachine blade remote from the hub.

The geometric blade parameters can comprise one or more curvature parameters or one or more thickness parameters.

In the invention, the geometric blade parameters comprise both one or more curvature parameters and one or more thickness parameters. Furthermore, a neural network of the neural network system which determines the curvature parameter(s) and outputs same via its output layer is different than that which determines and outputs the thickness parameter(s).

Said thickness parameter(s) can be inter alia a profile thickness for the half of the trailing blade part, a leading edge radius (also called nose radius), a maximum profile thickness, a distance between leading edge and point of maximum thickness and/or a trailing edge angle or can comprise at least one of these parameters.

Within the meaning of the present invention, the "trailing blade part" means that part of a blade section/blade profile which extends from the position (on the chord line) of maximum profile thickness to the trailing edge of the turbomachine blade. The "half" of the trailing blade part refers to half the path from the position of maximum profile thickness to the trailing edge of the turbomachine blade (along the chord line).

Said curvature parameter(s) can be inter alia a maximum profile camber, a distance between leading edge and point of maximum camber, an angle between the chord line and the camber line at the trailing edge and/or a stagger angle or comprise at least one of these parameters.

In another embodiment variant of the invention, the geometric blade parameters parameterize a freeform curve which characterizes one or more blade surfaces. Said freeform curve can be in particular a Bézier curve.

In the invention, the input parameters communicated to the neural network system are two-dimensional parameters. The latter are parameters which are defined/definable in each case by a value pair (that is to say by two associated values). The input parameters can represent for example at least one Mach number distribution, in particular a suction-side Mach number distribution and/or a pressure-side Mach number distribution. Alternatively or additionally, the input parameters can represent at least one pressure distribution, in particular a suction-side pressure distribution and/or a pressure-side pressure distribution.

A Mach number distribution in the present case should be understood to be a Mach number as a function of the normalized chord of the turbomachine blade or the profile of this function. Analogously, a pressure distribution in the present case should be understood to be a pressure as a function of the normalized chord of the turbomachine blade or the profile of this function.

Furthermore, it is advantageous if after the neural networks of the neural network system have been trained and before the blade parameters are determined, in the case of at least one of the neural networks, one or more existing neural connections are removed by means of a pruning method, such as, for example, "optimal brain damage", "early brain damage" or "inverse kurtosis". So-called overfitting can be prevented in this way. In addition, the generalization capability of the neural network system can be increased. That is to say that the quality of outputs on which the neural networks were not trained can be improved and the remaining optimization space for possible subsequent optimizations can be reduced.

Furthermore, the blade parameters determined by the neural network system can comprise a blade efficiency of the turbomachine blade. Alternatively or additionally, the blade parameters determined by the neural network system can comprise a logarithmic decrement of the turbomachine blade. The logarithmic decrement of the turbomachine blade is a measure of the damping behavior of the turbomachine blade.

It is particularly advantageous if the blade parameters determined by the neural network system comprise firstly geometric blade parameters and secondly at least one further blade parameter, such as, for example, the blade efficiency and/or the logarithmic decrement of the turbomachine blade. In this way it is possible, in particular, to bundle design/rating processes from different technical disciplines, such as fluid dynamics, strength, heat engineering, etc., in one common design/rating process, instead of carrying them out progressively as has been customary hitherto. Such a multidisciplinary design/rating process makes possible shorter design/rating times. In addition, such a multidisciplinary design/rating process can already greatly circumscribe the optimization space for possible subsequent optimizations of the individual technical disciplines.

Advantageously, a third neural network belongs to the separate neural networks of the neural network system (in addition to the first and second neural networks). It can be provided, for example, that the first neural network determines geometric blade parameters and outputs same via its output layer, the second neural network determines a blade efficiency and outputs same via its output layer, and the third neural network determines a logarithmic decrement of the turbomachine blade and outputs same via its output layer. In such a case, the neural network system supplies multidisciplinary parameters as blade parameters.

A so-called inverse design of the turbomachine blade can be achieved with the aid of the invention. That is to say that on the basis of predefined input parameters, it is possible to determine and output blade parameters, in particular geometric blade parameters, with which said input parameters can be realized.

In another embodiment of the invention, the input parameters communicated to the neural network system are one-dimensional parameters. The latter are parameters which are defined/definable in each case by a single value. The input parameters can be for example one or more flow variables, one or more thermodynamic variables and/or one or more geometric variables or comprise at least one of these parameters.

Said flow variable(s) can comprise for example an inflow Mach number, an outflow Mach number, an inflow angle, a deflection angle and/or a blade ring rotational speed or comprise at least one of these parameters.

Said geometric variable(s) can be for example a trailing edge radius and/or a pitch ratio or comprise at least one of these parameters.

A pitch ratio in the present case should be understood to be the ratio of a pitch of a blade ring (that is to say the distance between two adjacent blades of the blade ring along the circumferential line thereof) to a chord of the respective blade.

Furthermore, said thermodynamic variable(s) can be for example a suction-side temperature and/or a pressure-side temperature or comprise at least one of these parameters.

It is advantageous if at least one of the neural networks comprises an input layer and a plurality of intermediate layers (also referred to as "hidden layers") in addition to its aforementioned output layer. That is to say that, advantageously, at least one of the neural networks is a deep neural network. Expediently, the individual layers of such a neural network comprising a plurality of intermediate layers are hierarchically linked to one another. Deep neural networks are particularly well suited to determining difficult to predict (blade) parameters.

Advantageously, at least one of the layers of such a network determines a parameter that is communicated to one of the other layers of said neural network. In this way, for example, knowledge which was obtained or learned during the determination of an easier to predict parameter can be used for determining a more difficult to predict parameter.

Furthermore, provision can be made for at least one of the neural networks to comprise an ensemble of a plurality of neural subnetworks. The neural subnetworks of the ensemble can differ from one another with regard to their network structure, for example. Advantageously, the same input parameters are communicated to each neural subnetwork of said ensemble.

Advantageously, each neural subnetwork of said ensemble determines in each case a blade parameter value for the same blade parameter. Furthermore, it is advantageous if the blade parameter values determined by the neural subnetworks of the ensemble are averaged in a weighted or an unweighted fashion, wherein the averaged blade parameter value obtained in this way is output as blade parameter by the aforementioned neural network to which the ensemble belongs. The prediction error of the blade parameter that is output can be minimized by said averaging since the prediction errors of the individual subnetworks are averaged out.

The aforementioned neural network to which the ensemble belongs can comprise in particular a plurality of such ensembles. The latter can be hierarchically linked to one another. At least one of the ensembles can determine for example a parameter that is communicated as input parameter to one of the other ensembles of this neural network. In this way, for example, knowledge which was obtained or learned during the determination of an easier to predict parameter can be used for determining a more difficult to predict parameter.

The parameter communicated from one of the ensembles to one of the other ensembles of this neural network is advantageously a blade parameter that is output by the aforementioned neural network to which the ensembles belong via the output layer thereof.

Furthermore, at least one of the subnetworks of the respective ensemble can be embodied as a so-called "deep neural network".

As mentioned in the introduction, the invention relates to a method for producing a turbomachine blade.

The method according to the invention for producing a turbomachine blade comprises the following steps:—designing a turbomachine blade according to the method according to the invention for designing a turbomachine blade, wherein blade parameters are determined, —optionally modifying one or more of the blade parameters taking account of at least one optimization criterion, —producing the turbomachine blade in accordance with the blade parameters determined and optionally modified.

The second step of the production method is optional. That is to say that the turbomachine blade can be produced in accordance with the blade parameters determined with the aid of the neural network system, without the blade parameters determined being modified taking account of at least one optimization criterion.

In particular, an additive manufacturing method, such as, for example, selective laser melting, selective laser sintering or the like, can be used during the production of the turbomachine blade.

Moreover, as mentioned in the introduction, the invention relates to a computer unit and a machine-readable storage medium.

Embodiments, embodiment details and advantages described further above in association with the method according to the invention for designing a turbomachine blade can also relate to the computer unit according to the invention and the storage medium according to the invention.

The computer unit according to the invention is configured for carrying out the method according to the invention for designing a turbomachine blade. The computer unit comprises a neural network system configured to receive predefined input parameters and to determine blade parameters on the basis of the received input parameters and to output said blade parameters. According to the invention, the neural network system of the computer unit comprises a plurality of separate neural networks each having an output layer, each of which neural networks is configured to determine one or more of the blade parameters and to output same via its output layer. A first neural network and a second neural network belong to the separate neural networks. The first neural network is configured to determine one or more of the blade parameters and output same via its output layer. Furthermore, the second neural network is configured to determine one or more of the blade parameters and to output same via its output layer, the latter blade parameter(s) being different than the blade parameter(s) determined and output by the first neural network.

Setting up the computer unit for carrying out the method steps specified can be effected by equipping the computer unit with a corresponding computer program that enables the computer unit to carry out the method steps.

The machine-readable storage medium according to the invention comprises a program code which causes a computer unit to carry out the method according to the invention for designing a turbomachine blade when the program code is executed by the computer unit.

The machine-readable storage medium can be a part of the computer unit according to the invention or can be connected to the computer unit according to the invention.

The description given hereinbefore of advantageous configurations of the invention contains numerous features which are represented in part in a manner combined as a plurality of features in the individual dependent patent claims. However, these features can also be considered individually and combined to form expedient further combinations. In particular, these features are each combinable individually and in any suitable combination with the methods according to the invention, the computer unit according to the invention and the storage medium according to the invention. Furthermore, method features can also be regarded as a property of the corresponding device unit.

The above-described properties, features and advantages of the invention and the way in which they are achieved will become clearer and more clearly understood in association with the following description of the exemplary embodiments which are explained in greater detail in association with the figures. The exemplary embodiments serve for explaining the invention and do not restrict the invention to the combinations of features specified therein, nor do they restrict it with regard to functional features. Moreover, features of each exemplary embodiment which are suitable for this can also be considered explicitly in isolation, be removed from one exemplary embodiment, be introduced into another exemplary embodiment in order to supplement the latter and be combined with any of the claims.

DETAILED DESCRIPTION OF INVENTION

Figure 1:
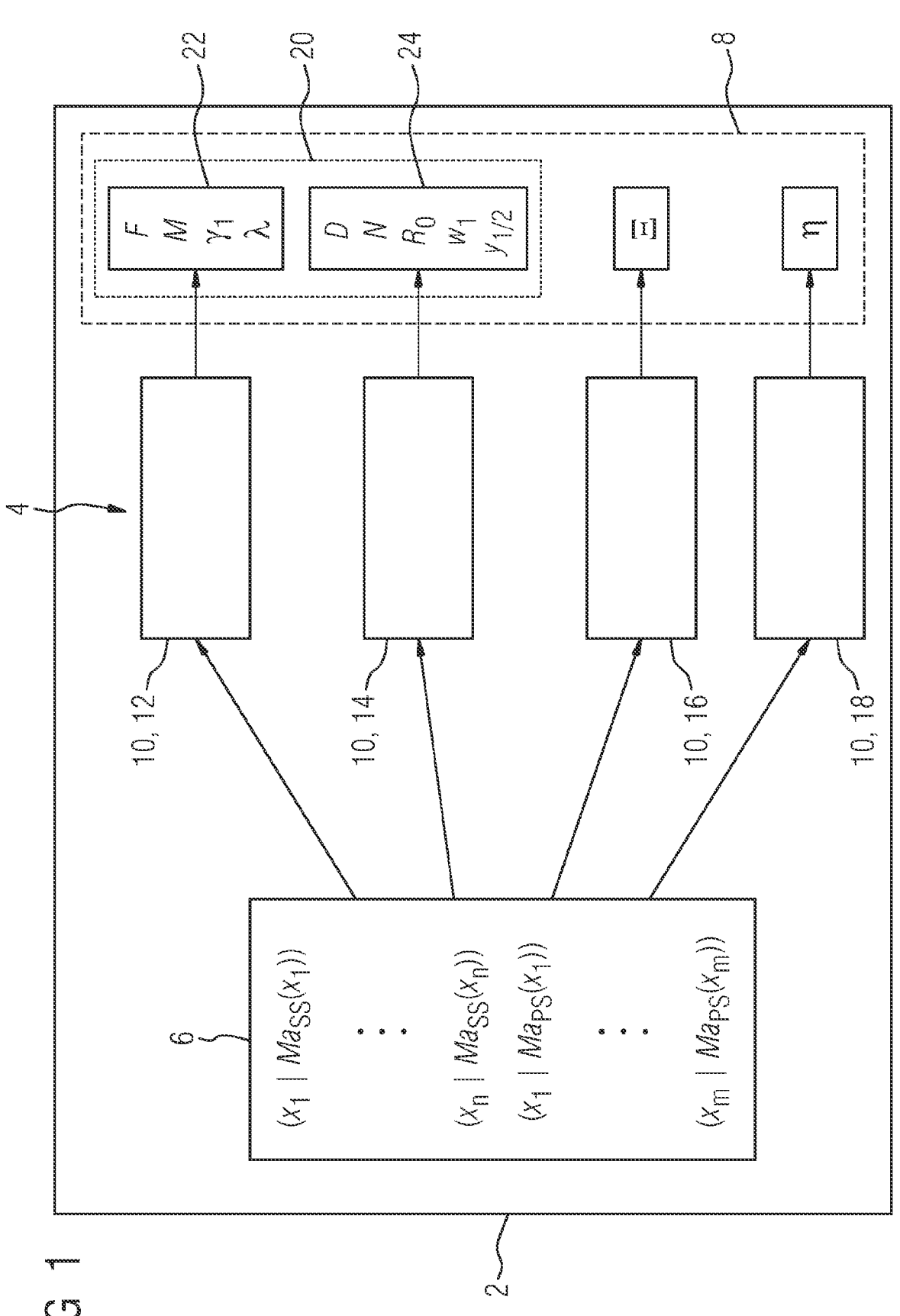
FIG. 1 shows one exemplary embodiment of a first computer unit according to the invention for designing a turbomachine blade.

FIG. 1 schematically shows a first computer unit 2 for designing a turbomachine blade.

This computer unit 2 comprises a neural network system 4 configured to receive predefined input parameters 6 and, on the basis of the received input parameters 6, to determine and output a plurality of blade parameters 8 characterizing the turbomachine blade to be designed and the envisaged arrangement/orientation thereof in a blade ring.

Figure 3:
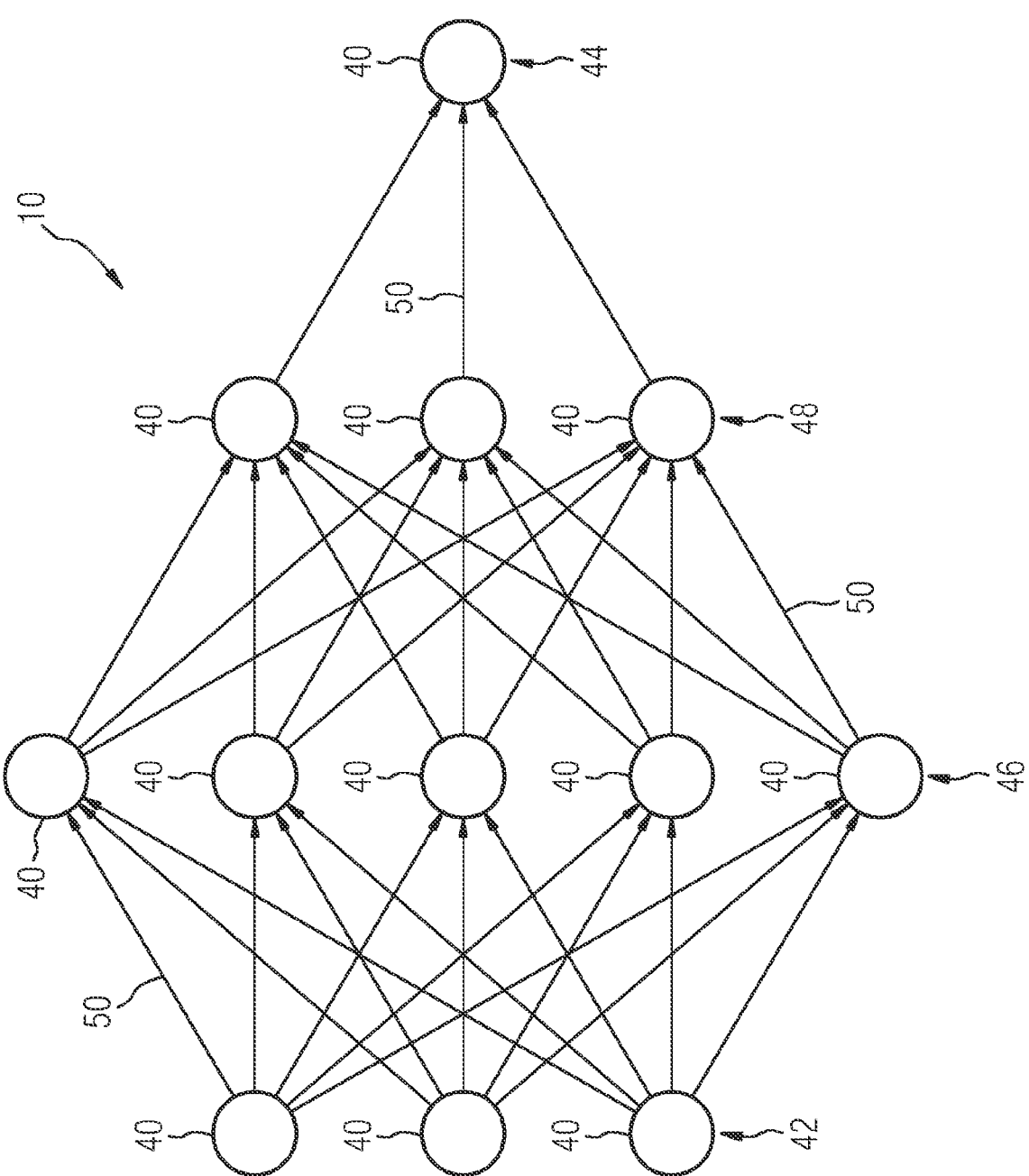
FIG. 3 shows a schematic illustration of a neural network depicting various layers of neurons of the neural network.

The neural network system 4 comprises a plurality of separate neural networks 10, each of which has an output layer (cf. FIG. 3). In the exemplary embodiment according to FIG. 1, the neural network system 4 comprises a first neural network 12, a second neural network 14, a third neural network 16 and a fourth neural network 18.

The input parameters 6 used by the neural network system 4 as a basis for determining and outputting the blade parameters 8 are communicated to each of the four neural networks 12-18. In the present exemplary embodiment, the input parameters 6 comprise n two-dimensional parameters representing a suction-side Mach number distribution $Ma_{SS}$ around a blade section, and m two-dimensional parameters representing a pressure-side Mach number distribution $Ma_{PS}$ around said blade section (cf. FIG. 4), wherein n and m are natural numbers greater than 1. In other words, the input parameters 6 represent n points of a suction-side Mach number distribution $Ma_{SS}$ and m points of a pressure-side Mach number distribution $Ma_{PS}$. Each of the input parameters 6 comprises a normalized chord $x_i$ as first value and the associated suction-side Mach number $Ma_{SS}(x_i)$ or pressure-side Mach number $Ma_{PS}(x_i)$ as second value.

The determination of the blade parameters 8 is divided among the four neural networks 12-18, wherein each of the four neural networks 12-18 determines one or more of the blade parameters 8 and outputs same via its output layer, and wherein that/those blade parameter(s) which is/are determined by the respective neural network 12-18 and output via its output layer is/are different than the blade parameters which are determined and output by the other neural networks 12-18.

The blade parameters determined by the first and second neural networks 12, 14 are geometric blade parameters 20. In the present exemplary embodiment, the first neural network 12 determines curvature parameters 22 of a blade profile (here by way of example a maximum profile camber F, a distance M between leading edge and point of maximum camber, an angle $\gamma_1$ between the chord line and the camber line at the trailing edge of the blade (cf. FIG. 2) and a stagger angle 2) and outputs them via its output layer. By contrast, the second neural network 14 determines thickness parameters 24 of said blade profile (here by way of example a profile thickness $\gamma_{1/2}$ for the half of the trailing blade part, a leading edge radius $R_0$, a maximum profile thickness D, a distance N between leading edge and point of maximum thickness and a trailing edge angle $w_1$) and outputs them via its output layer.

Furthermore, the third neural network 16 determines a logarithmic decrement E of the turbomachine blade as blade parameter and outputs it via its output layer. The fourth neural network 18 determines a blade efficiency n as blade parameter and outputs it via its output layer.

In principle, the neural network system 4 can comprise a different number of neural networks 10, 12-18. Furthermore, the determination of the blade parameters 8 can in principle be divided differently among the individual neural networks 10, 12-18.

Before the blade parameters 8 are determined with the aid of the neural network system 4, each of the four neural networks 12-18 is trained with the aid of training data based on a basic training data set containing data from earlier design and/or optimization projects. Before the training of the neural networks 12-18, firstly a check is made to ascertain whether the basic training data set contains redundant parameters. If the basic training data set contains redundant parameters, the data of the basic training data set purged of the redundant parameters serve as training data. Otherwise, all of the data of the basic training data set are used as training data.

After the neural networks 12-18 have been trained and before the blade parameters 8 are determined, optionally, in the case of one or more of the neural networks 12-18, respectively one or more existing neural connections (cf. FIG. 3) are removed by means of a pruning method.

The above-described process of designing a turbomachine blade is followed by production of the turbomachine blade.

Before the turbomachine blade is produced, optionally, at least one of the blade parameters 8 determined and output by the neural network system 4 can be modified taking account of at least one optimization criterion.

The turbomachine blade is produced in accordance with the blade parameters that have been determined by the neural network system 4 and optionally modified, for example with the aid of an additive manufacturing method.

Figure 2:
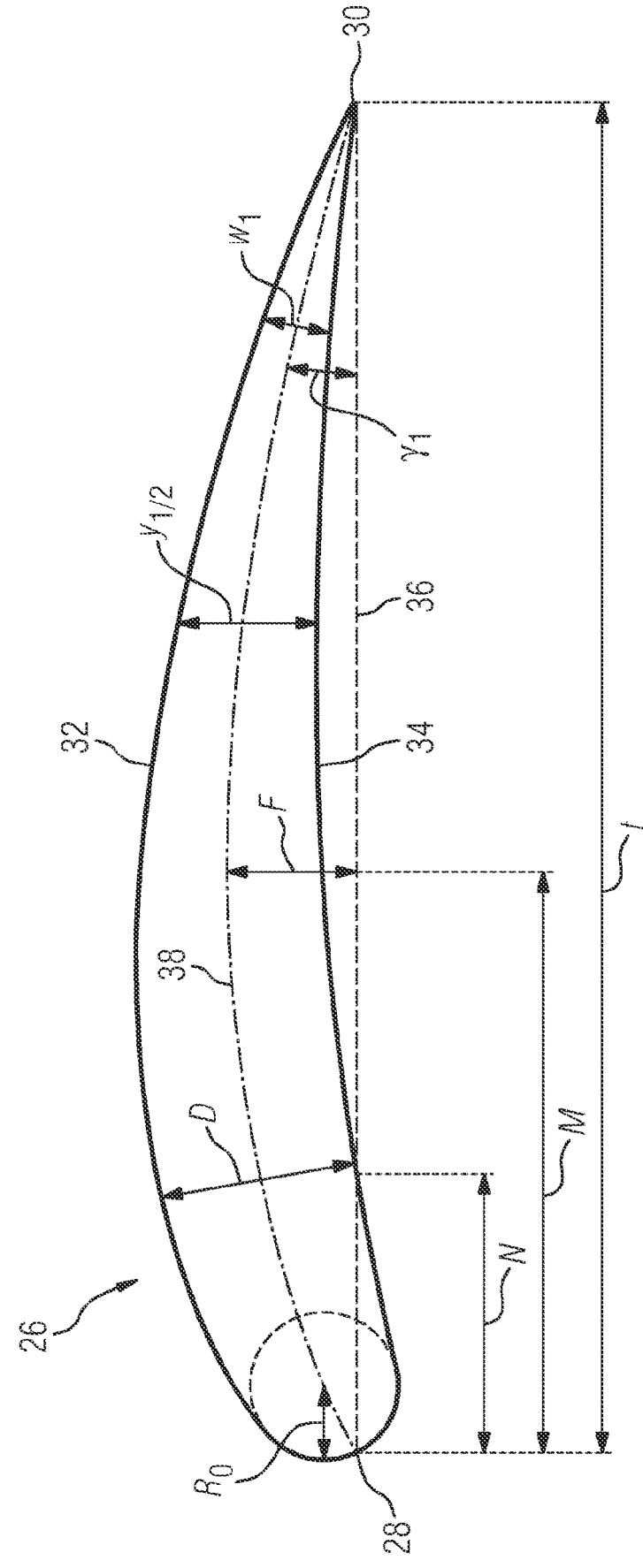
FIG. 2 shows a profile of a turbomachine blade.

FIG. 2 shows an exemplary profile of a turbomachine blade 26.

The turbomachine blade 26 comprises a leading edge 28 and a trailing edge 30. Furthermore, the turbomachine blade 26 has a blade top side 32 and a blade underside 34.

Both a chord line 36 and a camber line 38 of the turbomachine blade 26 are depicted in FIG. 2. Furthermore, some of the blade parameters 8 mentioned above are identified in FIG. 2.

The blade parameters 8 identified in FIG. 2 include, inter alia, the chord depth t of the turbomachine blade 26 (i.e. the length of the chord line 36), the leading edge radius $R_0$, the maximum profile thickness D, the maximum profile camber F (that is to say the largest deviation of the camber line 38 from the chord line 36), the trailing edge angle $w_1$ (i.e. the angle between the blade top side 32 and the blade underside 34 at the trailing edge 30) and the angle $\gamma_1$ between the chord line 36 and the camber line 38 at the trailing edge 30. Furthermore, the blade parameters 8 identified in FIG. 2 include the distance M between leading edge and point of maximum camber (that is to say the distance between the position of the maximum profile camber F and the leading edge 28 along the chord line 36), the distance N between leading edge and point of maximum thickness (that is to say the distance between the position of the maximum profile thickness D and the leading edge 28 along the chord line 36) and the profile thickness $\gamma_{1/2}$ for the half of the trailing blade part.

FIG. 3 shows a schematic illustration that illustrates the basic construction of a neural network 10.

The neural network 10 illustrated in FIG. 3 comprises a multiplicity of artificial neurons 40 that form a plurality of layers. In the present case, the neurons 40 form an input layer 42 for receiving input parameters, an output layer 44 and also a first intermediate layer 46 and a second intermediate layer 48. One or more output parameters determined by the neural network 10 on the basis of the input parameters is/are output via the output layer 44 of the neural network 10.

In the case of the neural network 10 from FIG. 3, the input layer 42 and the second intermediate layer 48 comprise three neurons 40, while the first intermediate layer 46 comprises five neurons 40 and the output layer 44 comprises one neuron 40, wherein the number of neurons 40 of the respective layer 42-48 was chosen merely by way of example.

The individual layers 42-48 of the neural network 10 are linked to one another by neural connections 50, each of which connects two of the neurons 40 to one another. In the present case, each neuron 40 of the input layer 42 is connected to each neuron 40 of the first intermediate layer 46. Furthermore, the neurons 40 of the first intermediate layer 46 are each connected to each neuron 40 of the second intermediate layer 48. Each neuron 40 of the second intermediate layer 48 is in turn connected to the neuron 40 of the output layer 44.

The four abovementioned neural networks 12-18 of the neural network system 4 from FIG. 1 can each have such a construction or a similar construction. In particular, the respective neural network 12-18 of the neural network system 4 can have a different number of intermediate layers 46, 48, a different number of neurons 40 and a different number of neural connections 50.

Figure 4:
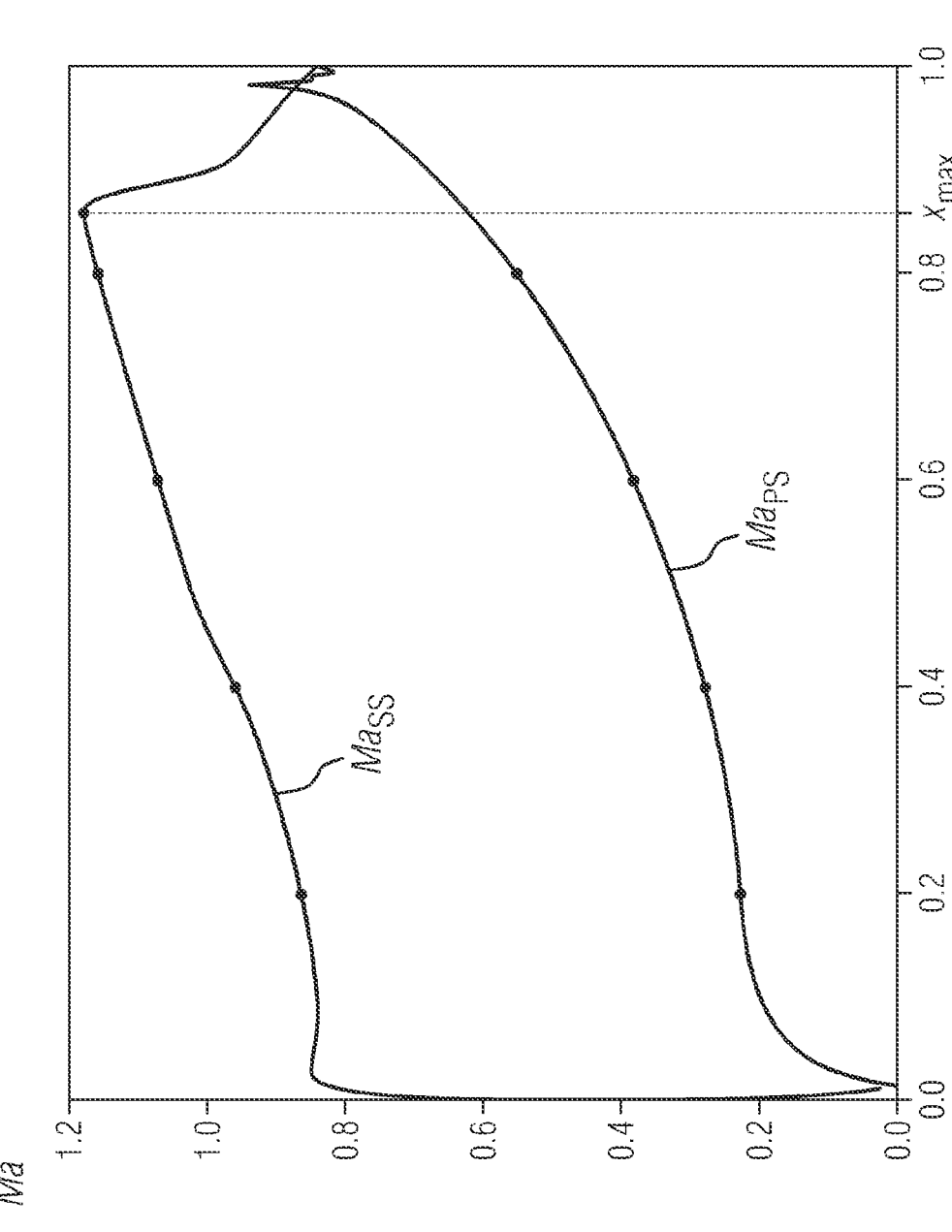
FIG. 4 shows a diagram illustrating a pressure-side and a suction-side Mach number distribution.

FIG. 4 shows an axis diagram, the ordinate axis of which represents a Mach number Ma and the abscissa axis of which represents the normalized chord x of a turbomachine blade, wherein the value 0 of the normalized chord x corresponds to the leading edge position of the turbomachine blade and the value 1 of the chord x corresponds to the trailing edge position of the turbomachine blade.

The diagram depicts an exemplary suction-side Mach number distribution $Ma_{SS}$ around a blade section and an exemplary pressure-side Mach number distribution $Ma_{PS}$ around said blade section.

Furthermore, FIG. 4 depicts some points of the suction-side Mach number distribution $Ma_{SS}$ and some points of the pressure-side Mach number distribution $Ma_{PS}$, which can be communicated for example as input parameters to the neural network system 4 from FIG. 1.

Specifically, the suction-side Mach number distribution $Ma_{SS}$ concerns the points: $(0.2|Ma_{SS}(0.2))$, $(0.4|Ma_{SS}(0.4))$, $(0.6|Ma_{SS}(0.6))$, $(0.8|Ma_{SS}(0.8))$ and $(x_{max}|(Ma_{SS}(x_{max}))$. The pressure-side Mach number distribution $Ma_{PS}$ concerns the points: $(0.2|Ma_{PS}(0.2))$, $(0.4|Ma_{PS}(0.4))$, $(0.6|Ma_{PS}(0.6))$ and $(0.8|Ma_{PS}(0.8))$. Alternatively or additionally, other points of the suction-side Mach number distribution $Ma_{SS}$ and/or other points of the pressure-side Mach number distribution $Ma_{PS}$ can be communicated as input parameters to the neural network system 4 from FIG. 1.

Figure 5:
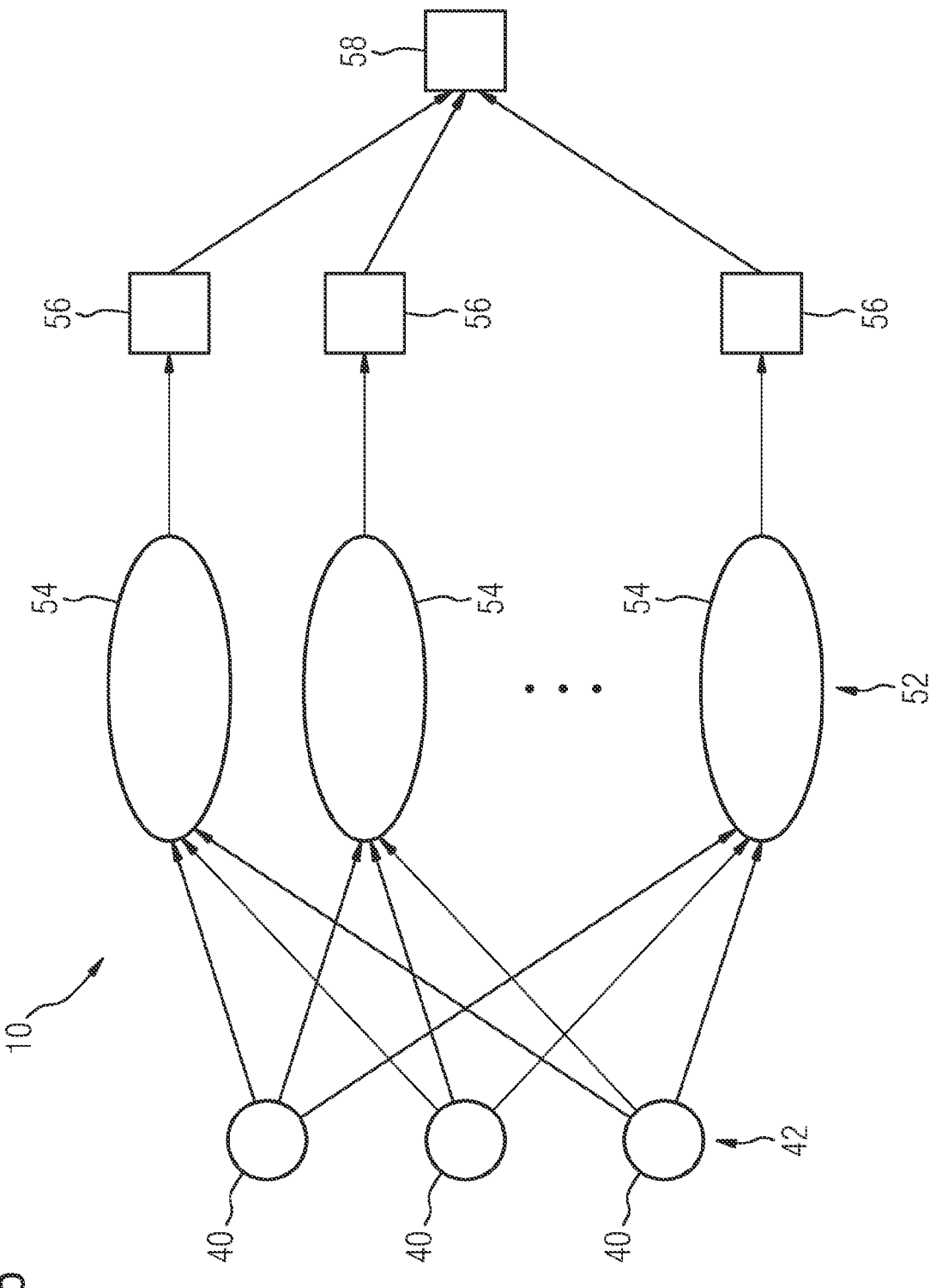
FIG. 5 shows a schematic illustration of a neural network comprising an ensemble of a plurality of subnetworks.

FIG. 5 shows a schematic illustration of a neural network 10 for determining one or more blade parameters.

The neural network 10 from FIG. 5 has an input layer 42 comprising a plurality of artificial neurons 40. Furthermore, this neural network 10 comprises an ensemble 52 of a plurality of neural subnetworks 54, each of which is linked to the input layer 42. The ensemble 52 of neural subnetworks 54 is advantageously formed by neurons of one or more intermediate layers (not illustrated in FIG. 5) of the neural network 10.

The input layer 42 or its neurons 40 receive(s) input parameters which are communicated to each of the neural subnetworks 54 of the ensemble 52. On the basis of the input parameters, each neural subnetwork 54 of the ensemble 52 determines in each case a blade parameter value 56 for the same blade parameter (for example for the maximum profile thickness D). The individual blade parameter values 56 are averaged (in a weighted or an unweighted fashion), whereby an averaged blade parameter value 58 is obtained. The averaged blade parameter value 58 is output as blade parameter by the neural network 10 via the output layer (not illustrated in FIG. 5) thereof.

Optionally, the neural network 10 can comprise at least one further ensemble of neural subnetworks of this type, which serves for determining a further blade parameter. In such a case, the averaged blade parameter value 58 can be communicated, besides the input parameters mentioned above, as an additional parameter to the further ensemble or the neural subnetworks thereof, such that the averaged blade parameter 58 can be included in the determination of the further blade parameter.

One or more of the four neural networks 12-18 of the neural network system 4 from FIG. 1 can have the same construction and the same functioning as the neural network 10 from FIG. 5.

The description of the exemplary embodiment below is limited primarily to the differences with respect to the preceding exemplary embodiment, to which reference is made with regard to identical features and functions. Identical and/or mutually corresponding elements, insofar as is expedient, are designated by the same reference signs and features not mentioned are adopted in the exemplary embodiment below, without their being described again.

Figure 6:
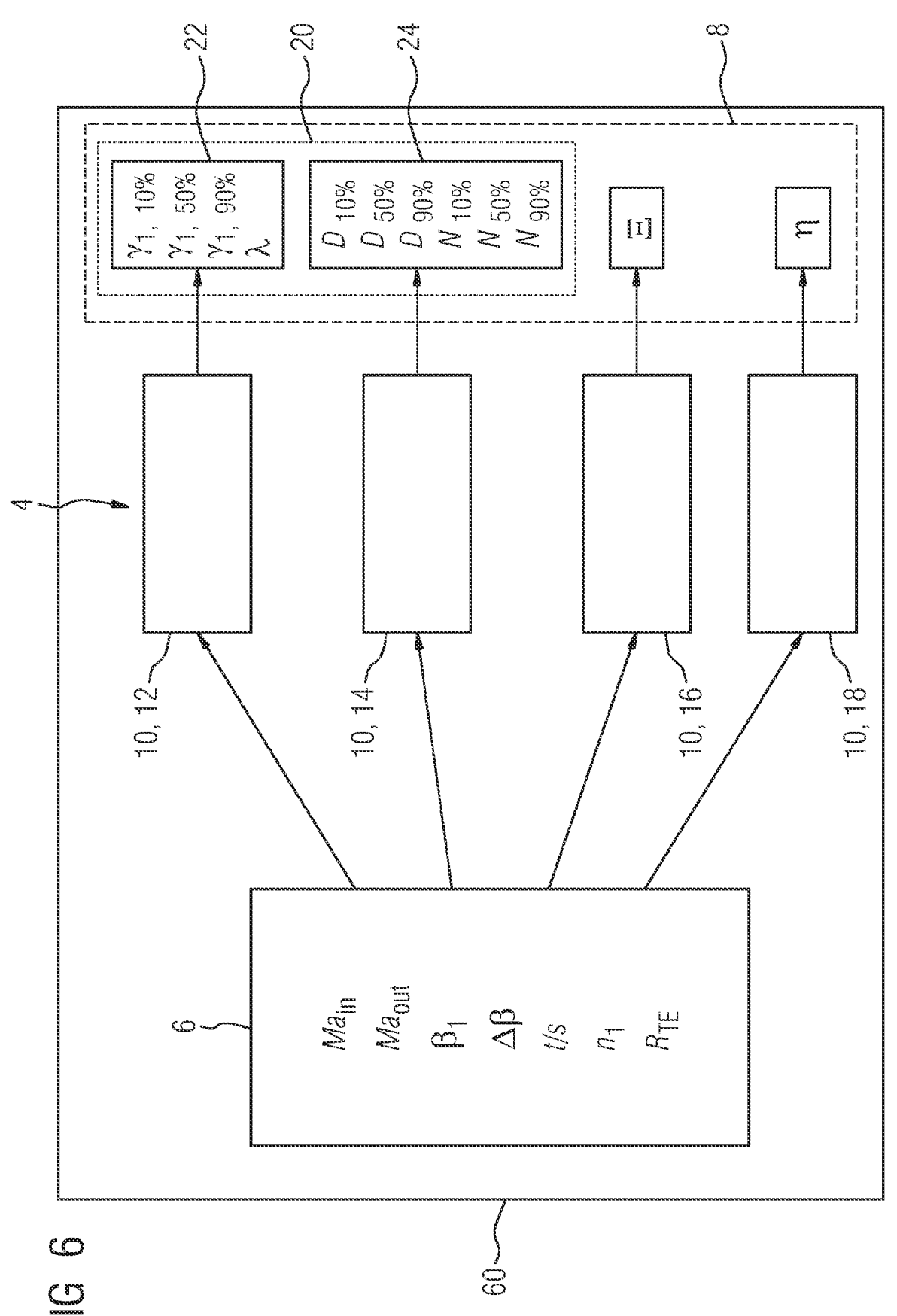
FIG. 6 shows one exemplary embodiment of a second computer unit according to the invention for designing a turbomachine blade.

FIG. 6 schematically shows a second computer unit 60 for designing a turbomachine blade.

Just like the computer unit 2 from FIG. 1, the computer unit 60 from FIG. 6 also comprises a neural network system 4 comprising a first, a second, a third and a fourth neural network 12-18.

In the present exemplary embodiment, one-dimensional parameters are communicated as input parameters 6 to the four neural networks 12-18 of the neural network system 4. In this case, the input parameters 6 comprise a plurality of flow variables (here by way of example an inflow Mach number $Ma_{in}$, an outflow Mach number $Ma_{out}$, an inflow angle $\beta_1$, a deflection angle $\Delta\beta$ and an envisaged blade ring rotational speed $n_1$). In addition, the input parameters 6 comprise geometric variables (here by way of example an envisaged trailing edge radius $R_{TE}$ and an envisaged pitch ratio t/s).

As in the preceding exemplary embodiment, in the present exemplary embodiment, too, the first and second neural networks 12, 14 determine and output geometric blade parameters 20.

In this case, the first neural network 12 determines curvature parameters 22 (here by way of example a stagger angle 2 and for various blade sections between an end of the turbomachine blade on the hub side and an end of said turbomachine blade remote from the hub in each case the angle $\gamma_1$ between the chord line and the camber line at the trailing edge of the blade) and outputs them via its output layer. By contrast, the second neural network 14 determines thickness parameters 24 (here by way of example for various blade sections between the end of the turbomachine blade on the hub side and the end of said turbomachine blade remote from the hub in each case the maximum profile thickness D and the distance N between leading edge and point of maximum thickness) and outputs them via its output layer.

The indices indicated in percent for some of the blade parameters 8 in FIG. 6 respectively denote the position of the blade section to which the respective blade parameter relates. The meaning of these indices (indicated in percent) is defined in the present case as follows: an index of 0% corresponds to the end of the turbomachine blade on the hub side, while an index of 100% corresponds to the end of the turbomachine blade remote from the hub. Consequently, the index 50% corresponds to a position midway between the end of the turbomachine blade on the hub side and the end of said turbomachine blade remote from the hub.

Although the invention has been more specifically illustrated as described in detail by means of the exemplary embodiments, nevertheless the invention is not restricted by the examples disclosed and other variations can be derived therefrom, without departing from the scope of protection of the invention.

The invention claimed is:

1. A computer-implemented method for designing a turbomachine blade, comprising:

communicating predefined input parameters to a neural network system;

determining blade parameters by the neural network system based on the communicated predefined input parameters;

outputting said blade parameters;

wherein the neural network system comprises a plurality of separate neural networks including a first neural network to determine at least one of the blade parameters, and a second neural network to determine at least a different one of the blade parameters;

wherein the at least one of the blade parameters is fewer than all of the blade parameters, and the at least the different one of the blade parameters is fewer than all of the blade parameters;

wherein the first neural network and the second neural network are configured to determine fewer blade parameters as compared to the blade parameters being determined by a same neural network;

wherein before the blade parameters are determined, the first neural network and the second neural network are trained with training data, with the training data being a subset of a basic training data set that includes data obtained during earlier designs of turbomachine blades and/or during earlier optimizations of turbomachine blade designs;

determining whether the basic training data set contains redundant parameters from a statistical standpoint and from a physical standpoint, with the statistical standpoint using Pearson correlation coefficient to measure linear correlation between two parameters in the basic training data set, filtering the redundant parameters so that a number of predefined input parameters required for determining the blade parameters is reduced and a topology of the neural network system is reduced;

wherein the blade parameters determined by the neural network system comprise geometric blade parameters;

wherein the geometric blade parameters comprise at least one curvature parameter and at least one thickness parameter, wherein the first neural network system determines the at least one curvature parameter and the second neural network system determines the as least one thickness parameter, or wherein the geometric blade parameters parameterize a freeform curve or a Bézier curve, which characterizes one or more blade surfaces; and wherein the predefined input parameters communicated to the neural network system are two-dimensional parameters including a suction-side Mach number distribution a pressure-side Mach number distribution, and at least one pressure side distribution.

2. The method as claimed in claim 1, wherein the neural network system comprises a plurality of neural connections, and wherein after the neural network system has been trained by the training data and before the blade parameters are determined, at least one of the neural connections is removed by a pruning method.

3. The method as claimed in claim 1, wherein the blade parameters determined by the neural network system comprise a blade efficiency of the turbomachine blade and/or a logarithmic decrement of the turbomachine blade.

4. The method as claimed claim 1, wherein the neural network system comprises a third neural network to determine a logarithmic decrement of the turbomachine blade, and a fourth neural network to determine a blade efficiency of the turbomachine blade.

5. The method as claimed in claim 1, wherein at least one of the first neural network and the second neural network comprises a plurality of intermediate layers.

6. The method as claimed in claim 1, wherein at least one of the first neural network and the second neural network comprises an ensemble of a plurality of neural subnetworks, wherein each neural subnetwork determines a blade parameter value for one of the blade parameters, and wherein the blade parameter values as determined by the ensemble of the plurality of neural subnetworks are averaged in a weighted or an unweighted fashion, wherein each averaged blade parameter value obtained in this way is output as one of the blade parameters.

7. A method for producing a turbomachine blade using the method of claim 1, comprising:

optionally modifying the blade parameters based on at least one optimization criterion; and producing the turbomachine blade in accordance with the blade parameters determined and optionally modified.

8. A computer for carrying out the method of claim 1 the neural network system configured to receive the predefined input parameters and to determine the blade parameters based on the received predefined input parameters and to output said blade parameters, and wherein the neural network system comprises the plurality of separate neural networks including the first neural network and the second neural network.

9. A non-transitory machine-readable storage medium, comprising:

a program code which causes a computer to carry out the method of claim 1 when the program code is executed by the computer.

* * * * *